United States Patent
Chen et al.

(10) Patent No.: US 8,132,130 B2
(45) Date of Patent: Mar. 6, 2012

(54) METHOD, PROGRAM PRODUCT AND APPARATUS FOR PERFORMING MASK FEATURE PITCH DECOMPOSITION FOR USE IN A MULTIPLE EXPOSURE PROCESS

(75) Inventors: Jang Fung Chen, Cupertino, CA (US); Duan-Fu Stephen Hsu, Fremont, CA (US); Douglas Van Den Broeke, Sunnyvale, CA (US); Thomas Laidig, Point Richmond, CA (US)

(73) Assignee: ASML Masktools B.V., Veldhoven (NL)

( * ) Notice: Subject to any disclaimer, the term of this patent is extended or adjusted under 35 U.S.C. 154(b) by 1154 days.

(21) Appl. No.: 11/472,544

(22) Filed: Jun. 22, 2006

(65) Prior Publication Data

US 2007/0031740 A1 Feb. 8, 2007

Related U.S. Application Data

(60) Provisional application No. 60/692,574, filed on Jun. 22, 2005.

(51) Int. Cl.
G06F 17/50 (2006.01)

(52) U.S. Cl. ............... 716/54; 716/53; 430/5; 430/333

(58) Field of Classification Search ............. 716/53–54; 430/5, 333
See application file for complete search history.

(56) References Cited

U.S. PATENT DOCUMENTS

| | | | | |
|---|---|---|---|---|
| 5,340,700 A * | 8/1994 | Chen et al. | | 430/312 |
| 5,811,223 A * | 9/1998 | Bae | | 430/312 |
| 5,858,580 A * | 1/1999 | Wang et al. | | 430/5 |
| 5,879,866 A * | 3/1999 | Starikov et al. | | 430/395 |
| 6,068,955 A * | 5/2000 | Ziger | | 430/30 |
| 6,453,457 B1 * | 9/2002 | Pierrat et al. | | 716/53 |
| 6,470,489 B1 * | 10/2002 | Chang et al. | | 716/52 |
| 6,553,562 B2 * | 4/2003 | Capodieci et al. | | 716/53 |
| 6,569,583 B2 * | 5/2003 | Cho et al. | | 430/5 |
| 6,623,895 B2 * | 9/2003 | Chen et al. | | 430/5 |
| 6,664,010 B2 * | 12/2003 | Ahrens et al. | | 430/5 |
| 6,664,011 B2 * | 12/2003 | Lin et al. | | 430/5 |
| 6,665,858 B2 * | 12/2003 | Miyazaki | | 430/319 |
| 6,670,080 B2 * | 12/2003 | Sugita et al. | | 430/5 |
| 6,818,389 B2 * | 11/2004 | Fritze et al. | | 430/5 |
| 6,832,364 B2 * | 12/2004 | Heng et al. | | 716/21 |
| 6,835,510 B2 * | 12/2004 | Chen et al. | | 430/5 |
| 6,884,551 B2 * | 4/2005 | Fritze et al. | | 430/5 |
| 7,013,439 B2 * | 3/2006 | Robles et al. | | 716/53 |
| 7,124,394 B1 * | 10/2006 | Abrams et al. | | 716/19 |
| 7,172,838 B2 * | 2/2007 | Maurer et al. | | 430/5 |
| 7,246,342 B2 * | 7/2007 | Hsu et al. | | 716/53 |
| 7,310,797 B2 * | 12/2007 | Huckabay | | 716/51 |
| 7,588,868 B2 * | 9/2009 | Zach et al. | | 430/22 |
| 2002/0015899 A1 * | 2/2002 | Chen et al. | | 430/5 |
| 2003/0165749 A1 * | 9/2003 | Fritze et al. | | 430/5 |

(Continued)

*Primary Examiner* — Naum Levin

(74) *Attorney, Agent, or Firm* — Pillsbury Winthrop Shaw Pittman LLP

(57) ABSTRACT

A method for forming exposure masks for imaging a target pattern having features to be imaged on a substrate in a multi-exposure process. The method includes the steps of generating a set of decomposition rules defining whether a given feature of the target pattern is assigned to a first exposure mask or a second exposure mask; applying the decomposition rules to each of the features in the target pattern so as to assign each of the features in the target pattern to one of the first exposure mask or second exposure mask; and generating the first exposure mask and the second exposure mask containing the respective features assigned to each mask.

19 Claims, 7 Drawing Sheets

U.S. PATENT DOCUMENTS

2004/0003368 A1* 1/2004 Hsu et al. .................. 716/19
2004/0067423 A1* 4/2004 Chen et al. ................. 430/5
2004/0263816 A1* 12/2004 Van Dam .................. 355/67
2006/0075377 A1* 4/2006 Broeke et al. ............. 716/19

* cited by examiner

Original mask design

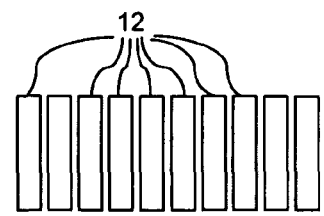

FIG. 1a

Feature pitch decomposition coloring. The dense features are assigned by two colors – red and green. The feature pitch becomes less dense for each colored features. Then, they are separately placed into two exposure masks – A & B.

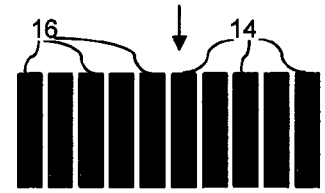

FIG. 1b

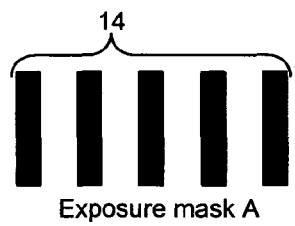

Exposure mask A

FIG. 1c

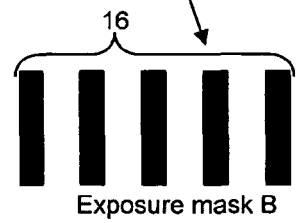

Exposure mask B

FIG. 1d

Step 1 – Expose mask A to define resist patterns.

 FIG. 2a

Step 2 – Transfer resist patterns to either "harden" patterns

 FIG. 2b

Step 3 – Re-apply resist coatings to become ready for the 2nd exposure

 FIG. 2c

Step 4 – Expose mask B to form another resist patterns adjacent to the ones formed by mask A exposure

 FIG. 2d

Step 5 – Transfer mask B and remove resist

 FIG. 2e

Figure 2. The two exposure process.

METHOD, PROGRAM PRODUCT AND APPARATUS FOR PERFORMING MASK FEATURE PITCH DECOMPOSITION FOR USE IN A MULTIPLE EXPOSURE PROCESS

PRIORITY INFORMATION

This application claims priority to U.S. Provisional Application Ser. No. 60/692,574, which was filed on Jun. 22, 2005, the contents of which are hereby incorporated by reference in their entirety.

TECHNICAL FIELD

The technical field of the present invention relates generally to a method, program product and apparatus for performing a decomposition of a target pattern so as to allow the target pattern to be imaged utilizing multiple masks in a multiple illumination process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

With the rapid downsizing of feature dimensions in semiconductor manufacturing, the IC industry has demanded exposure tools to be capable of printing device features having a pitch of one-half of the exposure wavelength. For example, for a ArF (193 nm) exposure, the desired feature pitch is below 100 nm. As is known, the printing resolution definition is:

$$\text{minimum half-pitch of critical features} = k1(\lambda/NA)$$

where, k1 is the process capability

λ is exposure wavelengths

NA is numerical aperture of the lens

The theoretical printing resolution limit is at k1=0.25. This means that, at this k1 level, there is no imaging contrast for such pitch features. For example, using today's state-of-the-art ArF exposure tools with NA=0.93, the minimum pitch can be printed is 100 nm or above. In reality, in order to obtain a reasonable process window, the k1 needs to be slightly above 0.27. This pushes up the minimum feature pitch to be at least greater than 108 nm. In order to print feature pitch below 108 nm, it is necessary to use shorter exposure wavelengths or higher NA, either of which can be quite an expensive capital equipment proposition and not feasible for a near term solution.

However, there are known techniques that allow for a reduction in the minimum CD that can be imaged or reproduced in a wafer. One such technique is the double exposure technique wherein features in the target pattern are imaged in two separate exposures. For example, one commonly known double exposure technique is dipole illumination. In this technique, during a first exposure the vertical edges of the target pattern (i.e., features) are illuminated and then during a second exposure the horizontal edges of the target pattern are illuminated. As noted, by utilizing two exposures, improved imaging performance may be obtained.

Another known double exposure technique allows the features of a given target pattern to be separated into two different masks and then imaged separately to form the desired pattern. Such a technique is typically utilized when the target features are spaced so closely together that it is not possible to image the individual features. In such a situation, for each exposure mask, the original pitch features are "decomposed" and separately placed into two exposure masks. For each mask, the feature pitch ranges increase and the k1 becomes much higher. The imaging for each exposure mask can then be more readily achievable with a less resolution demanding process. Such a process is illustrated in FIGS. 1a-1d. It is noted that this technique is also known as "coloring".

Referring to FIGS. 1a-1d, FIG. 1a illustrates a set of densely spaced features 12 having a pitch dimension which is too small to properly imaging the features using a single exposure. In order to decompose such a pattern, the features are alternately assigned one of two colors as shown in FIG. 1b so as to create a first set of features 14 and a second set of features 16. The first set of features 14 are then placed into a first exposure mask (as shown in FIG. 1c) and the second set of features 16 are placed into a separate second exposure mask (as shown in FIG. 1d). As can be seen, the features in both the first exposure mask and the second exposure mask exhibit a pitch which is greater than the pitch between the features in the original target pattern. The two exposure patterns are then imaged separately to create the desired target pattern shown in FIG. 1a.

FIGS. 2a-2e illustrate an exemplary two-exposure process for the exposure masks illustrated in FIGS. 1c and 1d. Referring to FIG. 2a, the first step of the two exposure process is to expose the first exposure mask to as to define resist patterns corresponding to the first set of features 14, and then the resist patterns are hardened (FIG. 2b). Next, resist is reapplied (FIG. 2c) and then the second exposure mask is exposed so as to form resist patterns corresponding to the second set of features 16 adjacent the first set of assist features 14. The result of the process is illustrated in FIG. 2e, which is a pattern corresponding to the densely spaced features illustrated in FIG. 1a.

While feature pitch decomposition for 1-dimensional features, such as illustrated in FIGS. 1a-1d, is generally well known by the lithography-engineering field, currently there is no known systematic process or methodology regarding how to decompose or "color" target patterns including complex and random 2D features. It is an object of the present invention to provide a systematic approach and method for coloring target patterns including complex 2-dimensional features and patterns.

SUMMARY OF THE INVENTION

In view of the foregoing, it is an object of the present invention to overcome the deficiencies of known prior art techniques by providing a systematic method for decomposing or coloring complex 2-dimensional features into multiple exposure masks.

In summary, the present invention provides a method for forming exposure masks for imaging a target pattern having features to be imaged on a substrate in a multi-exposure process. The method includes the steps of generating a set of decomposition rules defining whether a given feature of the target pattern is assigned to a first exposure mask or a second exposure mask; applying the decomposition rules to each of the features in the target pattern so as to assign each of the features in the target pattern to one of the first exposure mask or second exposure mask; and generating the first exposure mask and the second exposure mask containing the respective features assigned to each mask.

The present invention provides important advantages over the prior art. Most importantly, the present invention provides a systematic approach for decomposing a target pattern into multiple exposure masks. While typically highly-skilled engineers were required to perform the decomposition of target patterns including complex 2-dimensional features so as to ensure the resulting image would properly correspond to the target pattern, the present invention provides a systematic approach for decomposing target patterns which allows even a novice designer to perform the decomposition process.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

BRIEF DESCRIPTION OF THE DRAWINGS

FIGS. 1a-1d illustrate an exemplary prior art technique for decomposing a 1-dimensional pattern into multiple exposure masks.

FIGS. 2a-2e illustrate an exemplary two-exposure process for the exposure masks illustrated in FIGS. 1c and 1d.

DETAILED DESCRIPTION OF THE INVENTION

As explained in more detail below, the pattern decomposition process of the present invention systematically decomposes a target pattern so as to assign features (or portions thereof) of the target pattern to one of two (or more) exposure masks, which are illuminated separately in a multiple exposure process. Furthermore, as shown in the examples disclosed herein, the decomposition process of the present invention, when necessary, provides for decomposition of single geometry (i.e., feature) in the target pattern into multiple segments, which are then imaged in separate illumination processes.

Figure 3:
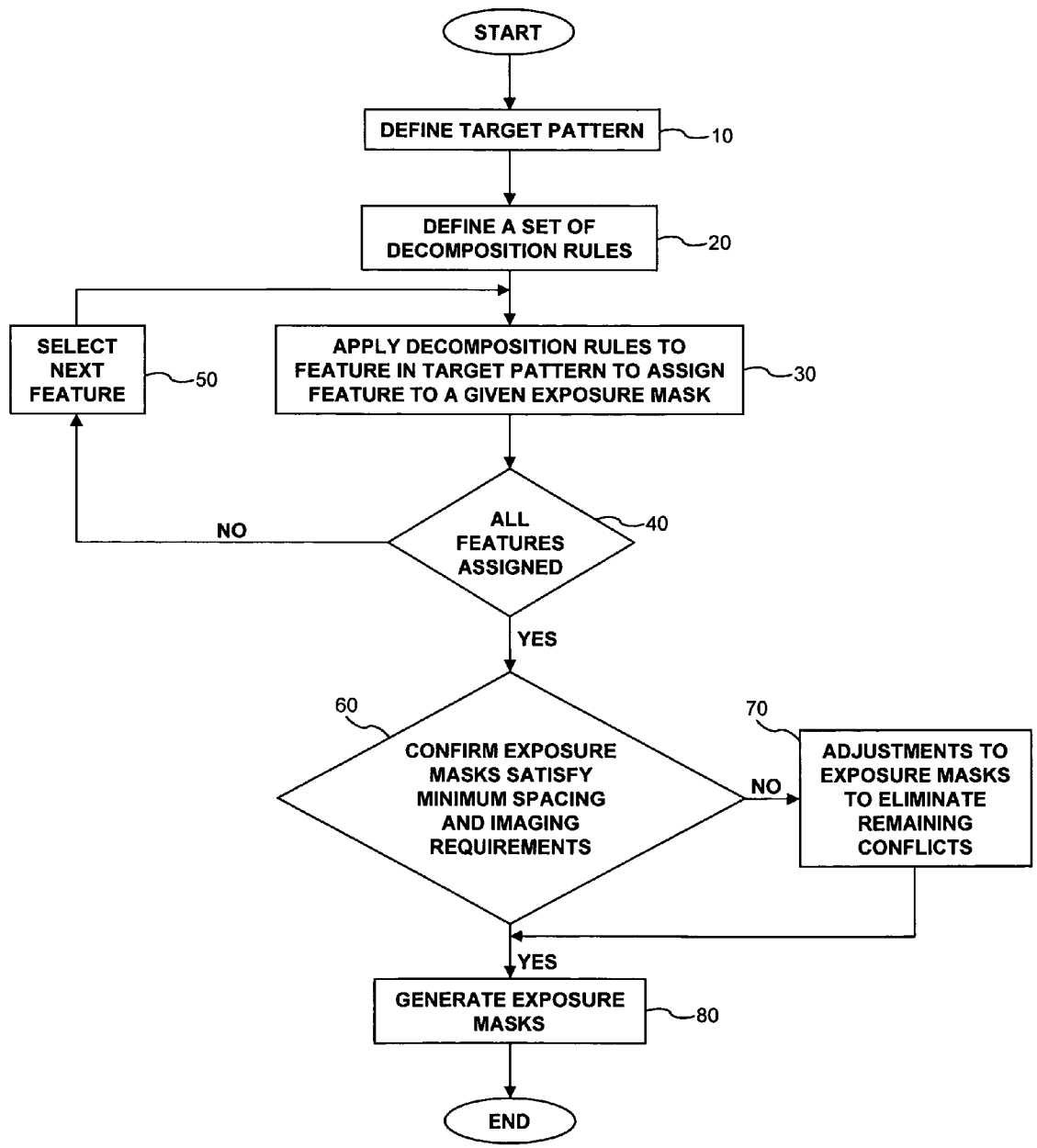
FIG. 3 is an exemplary flowchart illustrating an exemplary embodiment of the decomposition process of the present invention.

Referring to FIG. 3, which is an exemplary flowchart of a first embodiment of the decomposition process, the first step in the process (Step 10) is to define the target pattern (i.e., the pattern to be imaged on the substrate). The target pattern is typically described in a data format, such as "GDSII", which is a standard data format. However, any other suitable data format can also be utilized. The second step in the process (Step 20) is to define a set of decomposition rules. As explained in further detail below, in the given embodiment the decomposition rules are primarily based on the minimum allowable CD and the minimum allowable feature pitch. However, it is also possible to utilize other and/or additional criteria to define the decomposition rules utilized to assign features (or portions thereof) to a given exposure mask. The decomposition rules are utilized to define which exposure mask a given feature (or portion thereof) is assigned to. The next step (Step 30) is to apply the decomposition rules to a given feature in the target design so as to assign the given feature to one of the exposure masks. Once the first feature has been assigned to an exposure mask, the process proceeds to Step 40 to determine if all features in the target pattern have been assigned to one of the exposure masks. If no, the process proceeds to Step 50 and selects the next feature in the target design and returns to Step 30 to apply the decomposition rules to the next feature. It is noted that the assignment of a given feature into one of exposure masks considers the assignment of the previous features such that features in the target pattern having a pitch which is less than the acceptable minimum pitch are not both placed in the same exposure mask.

Alternatively, if all of the features have been processed and assigned, the process proceeds to Step 60 and confirms that, for each exposure mask, the placement and features contained in the given exposure mask satisfy all of the minimum spacing and critical dimension "CD" requirements of the imaging process. If not, the process proceeds to Step 70 and additional adjustments are made to the features in an effort to eliminate any remaining conflicts. For example, when initially assigning features to a given exposure mask, it is possible that a given feature may have been able to have been assigned to either exposure mask. If switching such a feature from one exposure mask to another exposure mask resolves a pending conflict, this is one adjustment that may be performed during Step 70. It is noted that standard conflict resolution techniques may be utilized to resolve remaining conflicts in the exposure masks. In the event that the conflicts are not resolvable, the design of the target pattern or the design rules may be revised or modified and the entire process illustrated in FIG. 1 repeated. Such design rule modification can be necessary to resolve coloring conflicts arising during the decomposition process. Of course, if design rule modification are made, these design rule changes must should be reflected in the set of decomposition rules.

In the event the exposure masks satisfy all spacing requirements (Step 60) or adjustments are made in Step 70 such that the adjusted exposure masks satisfy all spacing requirements, the exposure masks are complete and may be generated (Step 80) and utilized for imaging.

As stated, in the given embodiment the decomposition rules are based on the minimum allowable critical dimension of the features and the minimum allowable pitch. As such, it is first necessary to determine the minimum allowable CD and feature pitch for the illumination system and process to be utilized to image the exposure masks. The minimum allowable CD and feature pitch will be determined by factors including, for example, but are not limited to, type of illumination (i.e., annular, quadrature, off-axis, etc.), $\lambda$ (wavelength of source), NA (numerical aperture of projection lens) of the illumination system, type of resist, etc.

Once the minimum CD and feature pitch is defined for the given process, the rules, which can be implemented in a rule based program and executed in a computer or CAD system, first determine which features of the target pattern are non-critical and have CDs substantially above the minimum allowable CD for the process and have pitches above the minimum allowable feature pitch (e.g., isolated features). These non-critical features are then assigned to the same exposure mask. Next, it is determined which features are critical and have CDs approaching the minimum allowable CD of the process and have pitches equal to or below the minimum allowable feature pitch (e.g., densely spaced features). These features are then alternately assigned (i.e., colored) to the first and second exposure mask so no two adjacent densely spaced features (i.e., critical) are placed in the same exposure mask.

Figure 4A:
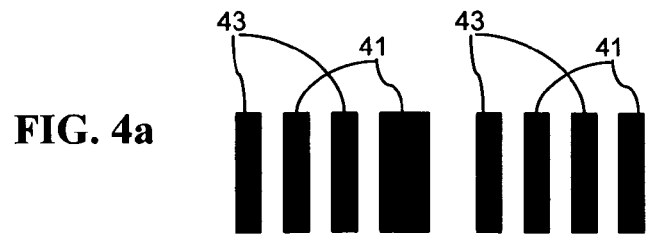
FIGS. 4a-4c illustrate examples of the coloring of various target patterns utilizing the process of the present invention.
Figure 4B:
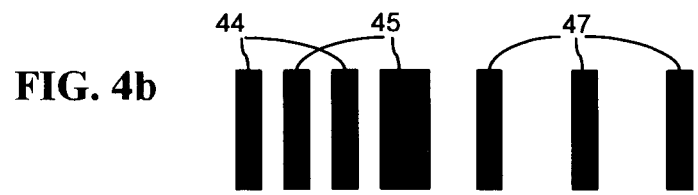
Figure 4C:

FIGS. 4*a*-4*c* illustrate examples of the coloring of various target patterns utilizing the process of the present invention and the foregoing rule set based on the CD value and minimum allowable pitch between the target features. FIG. 4*a* illustrates a target pattern having two sets of four densely spaced features. As there are no isolated features, the foregoing rules alternately assign (i.e., color) the features to different exposure masks. Referring to FIG. 4*a*, features 41 would be assigned to the first exposure mask, while features 43 would be assigned to the second exposure mask. FIG. 4*b* illustrates a target pattern having one set of four densely spaced features and one set of three isolated features. As such, the isolated features 47 are assigned to the same exposure mask, while of the four densely spaced features, features 44 are assigned to the first exposure mask and features 45 are assigned to the second exposure mask. It is noted that while the isolated features 47 are illustrated as being assigned to the first exposure mask, they could also be assigned to the second exposure mask. Finally, FIG. 4*c* illustrates a target pattern having five isolated features. As such, each of the five features 49 can be assigned to the same exposure mask, and the exposure mask can be either the first or second exposure mask. It is noted that as utilized in the foregoing example, isolated features are those features having a pitch which is greater than the minimal allowable pitch and densely spaced features are those features having a pitch which is equal to or less than the minimal allowable pitch. It is also noted that the rule set may contain additional categories (e.g., semi-dense) other than just isolated and dense, and may provide additional rules for use with each individual category.

In another embodiment of the present invention, the set of decomposition rules focus on first identifying 1-dimensional and 2-dimension features and then assigning the features to the exposure masks in a manner that prevents any two adjacent features in the same exposure mask from having a pitch which is less than the minimum allowable pitch. More specifically, this rule set first identifies 1-dimensional features (e.g., lines) and alternately assigns the 1-dimensional features to one of the two exposure masks. Next, 2-dimensional features having a pitch greater that the minimum allowable pitch are identified. As these features do not present any printing issues, they may be assigned to either exposure mask. It is also noted that the isolated 1-dimensional lines may also be assigned to either exposure mask as such features also do not raise any printing issues. Next, the 2-dimensional features which are densely spaced are identified, and similar to the 1-dimensional features, these 2-dimensional features are alternately assigned to the two exposure masks. Furthermore, the rule set also identifies any 2-dimensional feature which has a shape (e.g., an "H" structure) that may cause the individual feature itself to have imaging problems. For example, if the vertical lines of the "H" structure are separated by a distance which is less than the minimum allowable pitch. If any such feature is identified, the rules break down the individual 2-dimensional feature into multiple pieces and assigns the individual pieces such that the distance between each of the pieces in the individual exposure masks satisfy the minimum allowable pitch requirements.

Figure 5A:
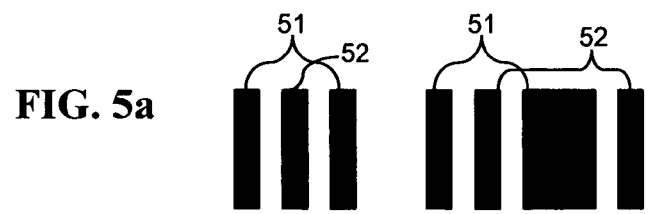
FIGS. 5a-6c illustrate examples of the coloring of various target patterns including 2-dimensional features.
Figure 5B:
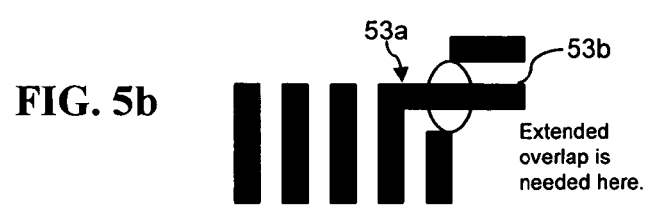
Figure 5C:
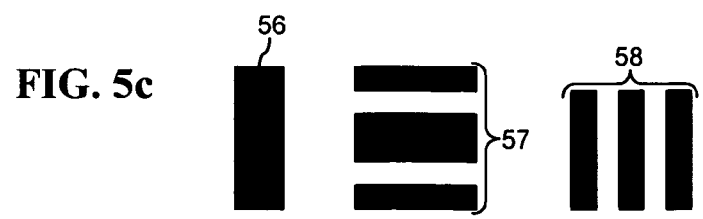

FIGS. 5a-5c illustrate examples of the coloring of various target patterns including 2-dimensional features. FIG. 5a is similar to FIG. 4a in that it illustrates 2 sets of densely spaced features. As there are no isolated features, the foregoing rules alternately assign (i.e., color) the features to different exposure masks. Referring to FIG. 4a, features 51 would be assigned to the first exposure mask, while features 52 would be assigned to the second exposure mask. FIG. 5b illustrates a set of densely spaced features where one of the features is a 2-dimensional feature exhibiting an "L-shape". Referring to FIG. 5b, in the given example, the horizontal portion of the L-shape feature is separated from the horizontal feature 54 by a distance which is less than the minimum allowable pitch requirements. As a result, the rule set will separate the horizontal portion into two segments 53a and 53b and assign these two segments to different exposure masks, thereby eliminating the conflict. The other features in the pattern of FIG. 5b are simply assigned to alternating exposure masks, as each of these features are densely spaced relative to the adjacent feature. It is noted that when segmenting an individual feature into two segments, it is necessary to extend the length of the end of the segments so as to compensate for line-end shorting that may occur during the imaging process so as to ensure that the segments form the desired single feature in the final image. FIG. 5c illustrates a target pattern having a large isolated feature 56, a set of horizontally disposed features 57 which are densely spaced, and a set of vertically disposed features 58 which are densely spaced. Applying the rule set to this target pattern, the isolated feature 56 can be assigned to either exposure mask, and each of the features in the set of horizontally disposed features and each of the features in the set of vertically disposed features are alternately assigned to the exposure masks as illustrated in FIG. 5c. It is noted that in each of the drawings, the darker and lighter shading of the features indicates which of the exposure masks the given feature (or portion thereof) is assigned to.

Figure 6A:
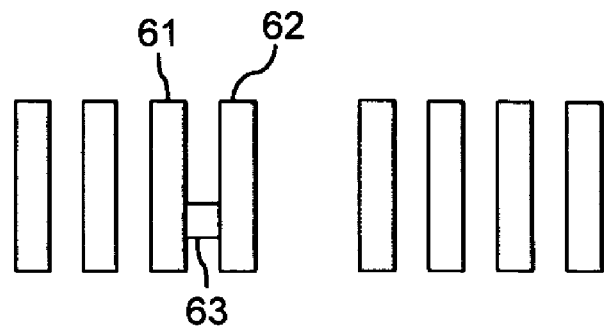
Figure 6B:
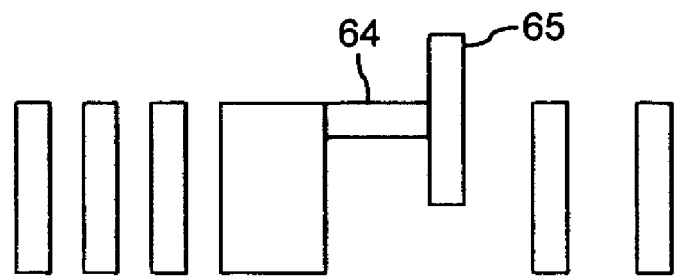
Figure 6C:
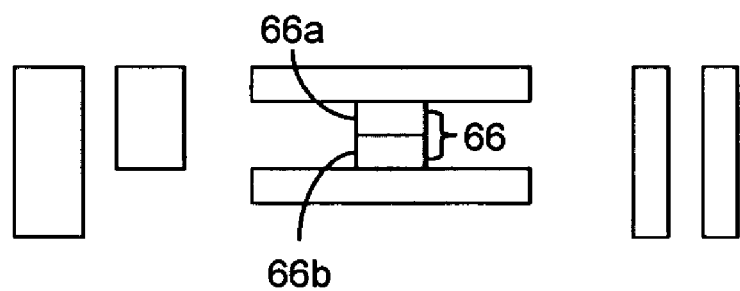

In another embodiment of the present invention, the set of decomposition rules also provide specific rules for decomposing the junctions (e.g., portions of the 2-dimensional feature connecting larger portions of the 2-dimesnional feature, such as occurring in "L" "H", "T", and "U" shaped features). In accordance with these rules, it is first determined if the larger portion of the 2-dimensional feature to which the junction connects is assigned to a given exposure mask. If so, the first option is to assign the junction to the same exposure mask as the larger portion of the feature. An example of such a case is shown in FIG. 6a, which illustrates two sets of densely spaced features. Two of the densely spaced features 61, 62 have a horizontal junction 63 connected between the features. As shown, the densely spaced features are alternately assigned to the two exposure masks. In accordance with the foregoing rule, the junction 63 is simply assigned to one of the exposure masks to which the feature it is connected to is assigned. In this case, as the features to which the junction 63 is coupled are assigned to each of the exposure masks, the junction 63 can be assigned to either exposure mask. FIGS. 6b and 6c illustrate additional examples of the coloring of junctions in accordance with the decomposition rules of the present invention. In FIG. 6b, the junction feature 64 is assigned to the same exposure mask as vertical feature 65 to which it connects. In FIG. 6c it is shown that the junction feature 66 may also be split into multiple segments 66a and 66b, with each segment being assigned to a separate exposure mask.

Accordingly, by implementing the foregoing rule based approach for decomposing target designs into multiple exposure masks, it is possible to categorize and implement decomposition rules for target patterns including random 2-dimensional complex features based on: a) feature linear dimension (critical dimension, or CD); b) feature shape; c) feature pitch; d) mixed feature pitch range in both dense and isolated features; e) random spacing width between features; f) feature with minimum spacing but with different feature CD; g) random mixes of adjacent features, isolated and dense with different CD's, and h) 2-dimensional feature junctions ("L", "T", "H", "spider", "U").

As explained above, the method of the present invention allows for the systematic decomposition of target patterns including random 2-dimensional feature geometry and the assigning of the features (or portions thereof) into separate exposure masks. The result is the generation of exposure masks with feature patterns corresponding to a higher k1 factor that requires less demanding resolution process. However, after the combined two exposures of the exposure masks, it is possible to achieve overall system resolution beyond the theoretical 0.25 k1 patterning limit.

Another advantage associated with the present invention provides is that it eliminates the need for a highly skilled mask designer to perform the decomposition process, as it effectively automates the decomposition process of the target pattern into multiple exposure masks.

Variations of the methods of the present invention are also possible. It is possible to develop other decomposition rules sets that categorize and assign the features to the exposure masks which are based on a combination of the rule sets discussed above, as well as any of the potential classifications of the features noted above.

In the first embodiment disclosed herein, the method of the present invention initially identifies the minimum allowable pitch and then breaks this down to the minimum CD and space requirements and then utilizes a set of decomposition rules based on the minimum pitch (CD and spacing requirements) to assign the features to the exposure masks in a manner which satisfies the design rules. A variation of this process entails the additional step of running a simulation utilizing the data of the exposure masks to ensure that the resulting image corresponds to the target pattern within the design tolerances.

Figure 7A:
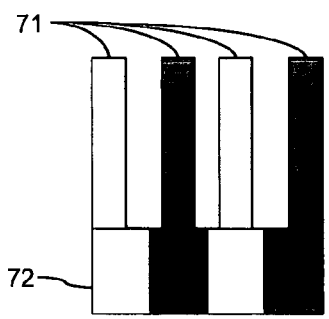
FIGS. 7a-7d illustrate examples of the cutting of "non-critical" and "critical" features.
Figure 7B:
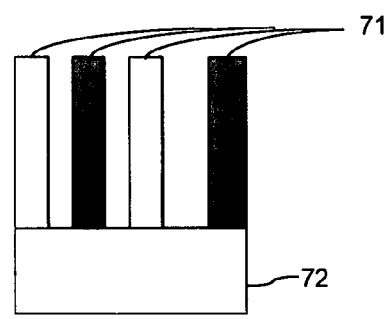
Figure 7C:
Figure 7D:

In another variation, when separating or "cutting" features to form multiple segments, the cut is made in a "non-critical feature" (i.e., a larger feature that is not approaching the minimal allowable CD of the given process) as opposed to a critical feature" (i.e., a feature having a CD approaching the minimal allowable CD). This is done so as to minimize coloring conflicts and overlay issues with the regard to the critical features. FIGS. 7a-7d illustrate this process. In FIGS. 7a and 7b illustrate a 2-dimensional feature having four "critical" vertical lines 71 disposed on a "non-critical" horizontal block 72. The four critical vertical lines 71 must be alternately assigned to different exposure masks. FIG. 7a illustrates how this feature may be segmented by cutting the non-critical feature 72. As shown in FIG. 7a, the non-critical block 72 is cut at points in between the critical features 71. This is preferable to the alternative shown in FIG. 7b in which the block 72 is left alone and the vertical lines 71 are cut at the contact point with the block, because, for example, the overlay issues with the critical features are more problematic than with the non-critical block feature. FIGS. 7c and 7d illustrate another example of where the non-critical feature is cut and the critical feature is cut, respectively. Once again, the decomposition shown in FIG. 7c is preferable.

When implementing the foregoing process of cutting "non-critical features" as opposed to "critical features", the decomposition rules should reflect the following rules. First, critical features should be identified and designated and treated as a 1-dimensional feature, thereby minimizing the likelihood that the feature will be segmented. Second, the decomposition rules should reflect a higher tolerance for accommodating coloring conflict for dense areas of 2-dimensional features (i.e., 2-dimensional interconnect areas, 2-dimensional "T" interaction (line-end to line edge), 2-dimensional line-end to line-end, etc.).

In such an embodiment of the present invention, there is effectively a three part sequence in which the decomposition rules are first utilized to identify critical features (and non-critical features) and the space to the adjacent neighboring features. Then, the decomposition rules are utilized to split or "cut" the non-critical features in the manner discussed above so as to minimize potential conflict issues. Finally, the design rules are selected so as to aid in the decomposition of the 1-dimensional and 2-dimensional features and allow sufficient room for end-to-end, line-end to line type features.

In another variation of the present invention, it is noted that optical proximity correction (OPC) techniques, such as model OPC, can be utilized in combination with the decomposition process of the present invention. More specifically, once the foregoing process has been executed and the multiple exposure masks have been generated, the exposure masks may be subjected to OPC treatment so as to further modify the exposure masks to include optically proximity correction features to enhance the imaging of the features in the exposure masks.

It is further noted that when the process of the present invention is being utilized to devices such as a memory device, the structures forming the memory cells need to be colored consistently, as due device structures intended for electrically balanced operation. As such, in such situations, the decomposition rules should also reflect this requirement.

Figure 8:
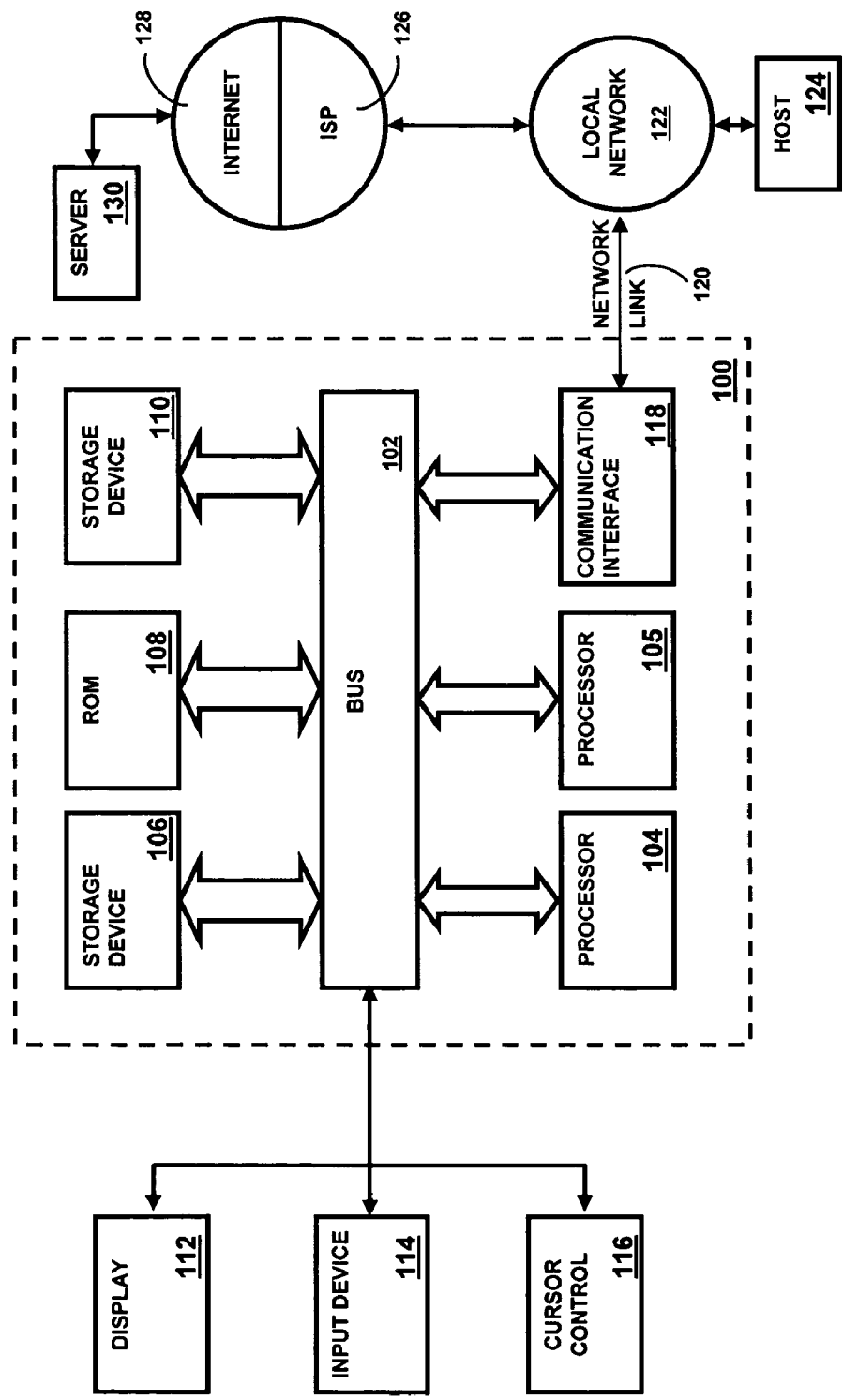
FIG. 8 is a block diagram that illustrates a computer system which can implement illumination optimization according to an embodiment of the present invention.

FIG. 8 is a block diagram that illustrates a computer system 100 which can implement the illumination optimization explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the decomposition process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
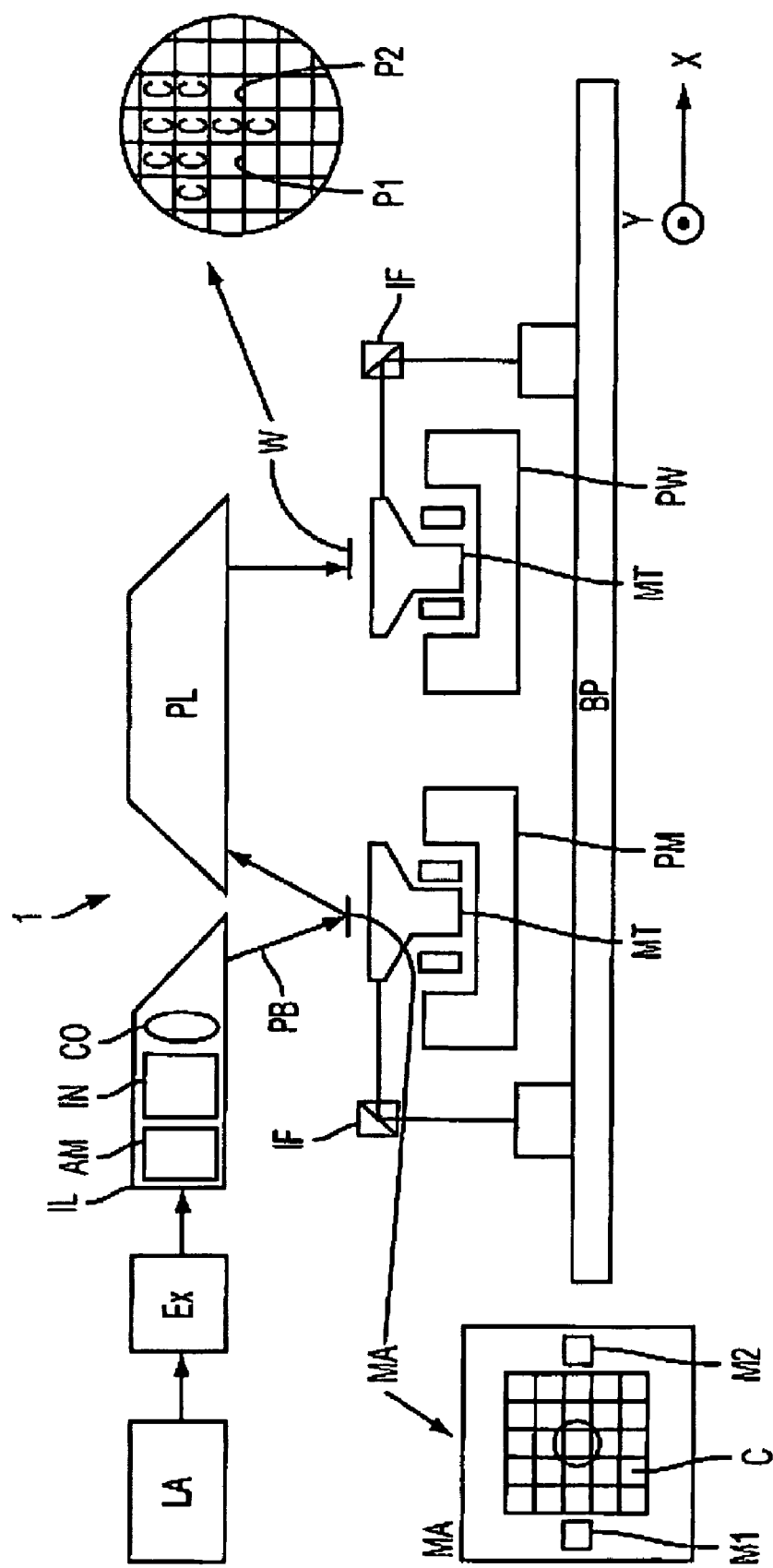
FIG. 9 schematically depicts an exemplary lithographic projection apparatus suitable for use with a mask designed with the aid of the disclosed concepts.

FIG. 9 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 9 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short-stroke actuator, or may be fixed.

The depicted tool can be used in two different modes:
- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method of decomposing a target pattern having features to be imaged on a substrate so as to allow said target pattern features to be imaged in a multi-exposure process, said computer-implemented method comprising the steps of:
    identifying one or more factors of a particular lithography process to be utilized to image exposure masks corresponding to said target pattern in the multi-exposure process;

generating, by the computer system, a set of decomposition rules based on said identified factors, wherein each decomposition rule corresponds to one or more predetermined characteristic categories of target pattern features, and wherein said set of decomposition rules collectively defines whether a given target pattern feature will be assigned to a first exposure mask or a second exposure mask according to said target pattern feature's predetermined characteristic category; and applying said set of decomposition rules to each of said target pattern features so as to assign each of said target pattern features to one of said first exposure mask or said second exposure mask.

2. The method of claim 1, wherein said decomposition rules designate each feature as being a critical feature or a non-critical feature, said designation being based on the critical dimension of the given feature and the spacing of the given feature to adjacent features.

3. The method of claim 2, wherein said decomposition rules allow for a given feature to be divided into multiple segments, with said multiple segments be assigned to different exposure masks of said first exposure mask and said second exposure mask.

4. The method of claim 3, wherein said decomposition rules prioritize treatment of critical features over non-critical features such that the preference is to not segment critical features during the assignment process.

5. A mask formed utilizing the method of claim 1.

6. The method of claim 1, wherein said factors comprise illumination system characteristics.

7. The method of claim 1, wherein said factors comprise lithography process parameters.

8. The method of claim 7, wherein said lithography process parameters include one or more of wavelength, numerical aperture and type of resist.

9. The method of claim 1, wherein said characteristic categories include: linear dimension of a feature, shape of a feature, pitch of a feature, mixed pitch range of features in dense and isolated areas, random spacing width between adjacent features, adjacent features with critical spacing therebetween but having different critical dimensions, and junctions of a feature.

10. A computer program product for controlling a computer comprising a storage device readable by the computer, means recorded on the storage device for directing the computer to decompose a target pattern having features to be imaged on a substrate so as to allow said target pattern features to be imaged in a multi-exposure process, the process comprising the steps of:

identifying one or more factors of a particular lithography process to be utilized to image exposure masks corresponding to said target pattern in the multi-exposure process;

generating a set of decomposition rules based on said identified factors, wherein each decomposition rule corresponds to one or more predetermined characteristic categories of target pattern features, and wherein said set of decomposition rules collectively defines whether a given target pattern feature will be assigned to a first exposure mask or a second exposure mask according to said target pattern feature's predetermined characteristic category; and applying said set of decomposition rules to each of said target pattern features so as to assign each of said target pattern features to one of said first exposure mask or said second exposure mask.

11. The computer program product of claim 10, wherein said decomposition rules designate each feature as being a critical feature or a non-critical feature, said designation being based on the critical dimension of the given feature and the spacing of the given feature to adjacent features.

12. The computer program product of claim 11, wherein said decomposition rules allow for a given feature to be divided into multiple segments, with said multiple segments be assigned to different exposure masks of said first exposure mask and said second exposure mask.

13. The computer program product of claim 12, wherein said decomposition rules prioritize treatment of critical features over non-critical features such that the preference is to not segment critical features during the assignment process.

14. A computer-implemented method for forming exposure masks for imaging a target pattern having features to be imaged on a substrate in a multi-exposure process, said method comprising the steps of:

identifying one or more factors of a particular lithography process to be utilized to image said exposure masks corresponding to said target pattern in the multi-exposure process;

generating, by the computer system, a set of decomposition rules based on said identified factors, wherein each decomposition rule corresponds to one or more predetermined characteristic categories of target pattern features, and wherein said set of decomposition rules collectively defines whether a given target pattern feature will be assigned to a first exposure mask or a second exposure mask according to said target pattern feature's predetermined characteristic category;

applying said set of decomposition rules to each of said target pattern features so as to assign each of said target pattern features to one of said first exposure mask or said second exposure mask; and generating said first exposure mask and said second exposure mask containing the respective target pattern features assigned to each exposure mask.

15. The method of claim 14, wherein said decomposition rules designate each feature as being a critical feature or a non-critical feature, said designation being based on the critical dimension of the given feature and the spacing of the given feature to adjacent features.

16. The method of claim 15, wherein said decomposition rules allow for a given feature to be divided into multiple segments, with said multiple segments be assigned to different exposure masks of said first exposure mask and said second exposure mask.

17. The method of claim 16, wherein said decomposition rules prioritize treatment of critical features over non-critical features such that the preference is to not segment critical features during the assignment process.

18. The method of claim 14, further comprising the step of performing optical proximity correction treatment to said first exposure mask and said second exposure mask.

19. A mask formed utilizing the method of claim 14.

* * * * *